(12) United States Patent
Someya et al.

(10) Patent No.: US 9,046,651 B2
(45) Date of Patent: Jun. 2, 2015

(54) MIRROR DEVICE

(75) Inventors: Hiroshi Someya, Hiratsuka (JP); Yukio Watanabe, Hiratsuka (JP); Katsuhiko Wakana, Oyama (JP); Osamu Wakabayashi, Hiratsuka (JP)

(73) Assignee: GIGAPHOTON INC., Tochigi (JP)

( * ) Notice: Subject to any disclaimer, the term of this patent is extended or adjusted under 35 U.S.C. 154(b) by 243 days.

(21) Appl. No.: 13/696,528

(22) PCT Filed: Dec. 29, 2011

(86) PCT No.: PCT/IB2011/003183
§ 371 (c)(1),
(2), (4) Date: Nov. 6, 2012

(87) PCT Pub. No.: WO2012/110847
PCT Pub. Date: Aug. 23, 2012

(65) Prior Publication Data
US 2013/0050862 A1   Feb. 28, 2013

(30) Foreign Application Priority Data

Feb. 18, 2011   (JP) ................. 2011-032876
Mar. 18, 2011   (JP) ................. 2011-060899

(51) Int. Cl.
*G02B 7/182*   (2006.01)
*G02B 7/18*   (2006.01)
*G03F 7/20*   (2006.01)

(52) U.S. Cl.
CPC ............ *G02B 7/181* (2013.01); *G03F 7/70033* (2013.01); *G03F 7/70175* (2013.01)

(58) Field of Classification Search
CPC .............. B60R 1/02; B60R 1/04; B60R 1/06; G02B 7/182; G02B 7/022; G02B 7/023; G02B 7/026; G03F 7/70825; G03B 21/10; G03B 21/28
USPC .................. 359/841, 871, 872, 877
See application file for complete search history.

(56) References Cited

U.S. PATENT DOCUMENTS 7,161,750 B2   1/2007   Takabayashi
7,253,975 B2   8/2007   Takabayashi
(Continued)

FOREIGN PATENT DOCUMENTS

JP   2003-172858 A   6/2003
JP   2003-227986 A   8/2003
(Continued)

OTHER PUBLICATIONS

Japanese Office Action with English translation issued in Japanese Application No. 2011-060899 issued on Dec. 10, 2013.
(Continued)

*Primary Examiner* — Euncha Cherry
(74) *Attorney, Agent, or Firm* — McDermott Will & Emery LLP (57) ABSTRACT

A mirror device may include: a mirror including a base plate, a reflective film on a first surface of the base plate, and a plurality of first protrusions on a second surface of the base plate; a plurality of support parts for respectively supporting the plurality of the first protrusions, each support part having a groove formed therein for guiding the first protrusion; and a plurality of clamps for respectively pressing the plurality of the first protrusions against the respective grooves in the plurality of the support parts.

17 Claims, 10 Drawing Sheets

(56) References Cited

U.S. PATENT DOCUMENTS

| | | |
|---|---|---|
| 7,410,265 B2 | 8/2008 | Antoni et al. |
| 7,859,641 B2 | 12/2010 | Bischoff et al. |
| 7,878,665 B2 * | 2/2011 | Imoto .......................... 353/100 |
| 2003/0147160 A1 | 8/2003 | Endoh et al. |
| 2003/0213889 A1 | 11/2003 | Miura |
| 2004/0218289 A1 | 11/2004 | Kino et al. |
| 2005/0078386 A1 | 4/2005 | Takabayashi |
| 2007/0014036 A1 | 1/2007 | Takabayashi |
| 2007/0195441 A1 | 8/2007 | Aizawa et al. |

FOREIGN PATENT DOCUMENTS

| | | |
|---|---|---|
| JP | 2004-062091 A | 2/2004 |
| JP | 2004-078209 A | 3/2004 |
| JP | 2009-058624 A | 3/2009 |
| JP | 2010-262026 A | 11/2010 |

OTHER PUBLICATIONS

International Search Report mailed Apr. 25, 2012 issued in corresponding International Application No. PCT/IB2011/003183.

\* cited by examiner

MIRROR DEVICE

CROSS-REFERENCE TO RELATED APPLICATIONS

The present application is the U.S. National Phase under 35 U.S.C. §371 of International Application No. PCT/IB2011/003183, filed on Dec. 29, 2011, which in turn claims priority from Japanese Patent Application No. 2011-032876 filed Feb. 18, 2011, and Japanese Patent Application No. 2011-060899 filed Mar. 18, 2011.

BACKGROUND

1. Technical Field

This disclosure relates to a mirror device.

2. Related Art

In recent years, semiconductor production processes have become capable of producing semiconductor devices with increasingly fine feature sizes, as photolithography has been making rapid progress toward finer fabrication. In the next generation of semiconductor production processes, microfabrication with feature sizes at 60 nm to 45 nm, and further, microfabrication with feature sizes of 32 nm or less will be required. Accordingly, in order to meet the demand for microfabrication at 32 nm and beyond, for example, an exposure apparatus is expected to be developed, in which a system for generating extreme ultraviolet (EUV) light at a wavelength of approximately 13 nm is combined with a reduced projection reflective optical system.

Three kinds of systems for generating EUV light have been known in general, which include an LPP (Laser Produced Plasma) type system in which plasma generated by irradiating a target material with a laser beam is used, a DPP (Discharge Produced Plasma) type system in which plasma generated by electric discharge is used, and an SR (Synchrotron Radiation) type system in which orbital radiation is used.

SUMMARY

A mirror device according to one aspect of this disclosure may include: a mirror including a base plate, a reflective film on a first surface of the base plate, and a plurality of first protrusions on a second surface of the base plate; a plurality of support parts for respectively supporting the plurality of the first protrusions, each support part having a groove for guiding the first protrusion; and a plurality of clamps for respectively pressing the plurality of the first protrusions against the respective grooves in the plurality of the support parts.

A mirror device according to another aspect of this disclosure may include: a mirror including a base plate, a reflective film on a first surface of the base plate, and a plurality of base members on a second surface of the base plate, each of the base members having a groove formed therein; a plurality of support parts for supporting the plurality of the base members respectively, each of the plurality of base parts including a protrusion to be guided along the groove formed in the base member; and a plurality of clamps for pushing the plurality of the base members respectively against the plurality of the protrusions.

BRIEF DESCRIPTION OF THE DRAWINGS

Hereinafter, selected embodiments of this disclosure will be described with reference to the accompanying drawings.

DESCRIPTION OF PREFERRED EMBODIMENTS

Hereinafter, selected embodiments of this disclosure will be described in detail with reference to the accompanying drawings. The embodiments to be described below are merely illustrative in nature and do not limit the scope of this disclosure. Further, the configuration and operation described in each embodiment are not all essential in implementing this disclosure. Note that like elements are referenced by like reference numerals or symbols and duplicate descriptions thereof will be omitted herein. The embodiments of this disclosure will be illustrated following the table of contents below.

1. Summary
2. Overview of EUV Light Generation System
   2. 1 Configuration
   2. 2 Operation
3. Mirror Device Having Support Part and Clamp
   3. 1 Configuration
   3. 2 Operation
4. Embodiments of Mirror Support Mechanism
   4. 1 First Embodiment
   4. 2 Second Embodiment
   4. 3 Third Embodiment
   4. 4 Fourth Embodiment
   4. 5 Fifth Embodiment
   4. 6 Sixth Embodiment
   4. 7 Seventh Embodiment
   4. 8 Eighth Embodiment
   4. 9 Ninth Embodiment
   4. 10 Tenth Embodiment
   4. 11 Eleventh Embodiment
   4. 12 Twelfth Embodiment
   4. 13 Thirteenth Embodiment

1. Summary

In the embodiments of this disclosure, a protrusion or a groove may be formed in a surface opposite to a reflective surface of an EUV collector mirror. A groove or a protrusion may be so formed in a support part for supporting the EUV collector mirror to correspond to the protrusion and the groove of the EUV collector mirror, respectively. Such protrusion and groove are fitted to each other to position the EUV collector mirror with high reproducibility. Further, when the EUV collector mirror undergoes thermal expansion, the protrusion may slide along the groove to suppress unbalanced deformation in the EUV collector mirror.

2. Overview of EUV Light Generation System

2. 1 Configuration

Figure 1:
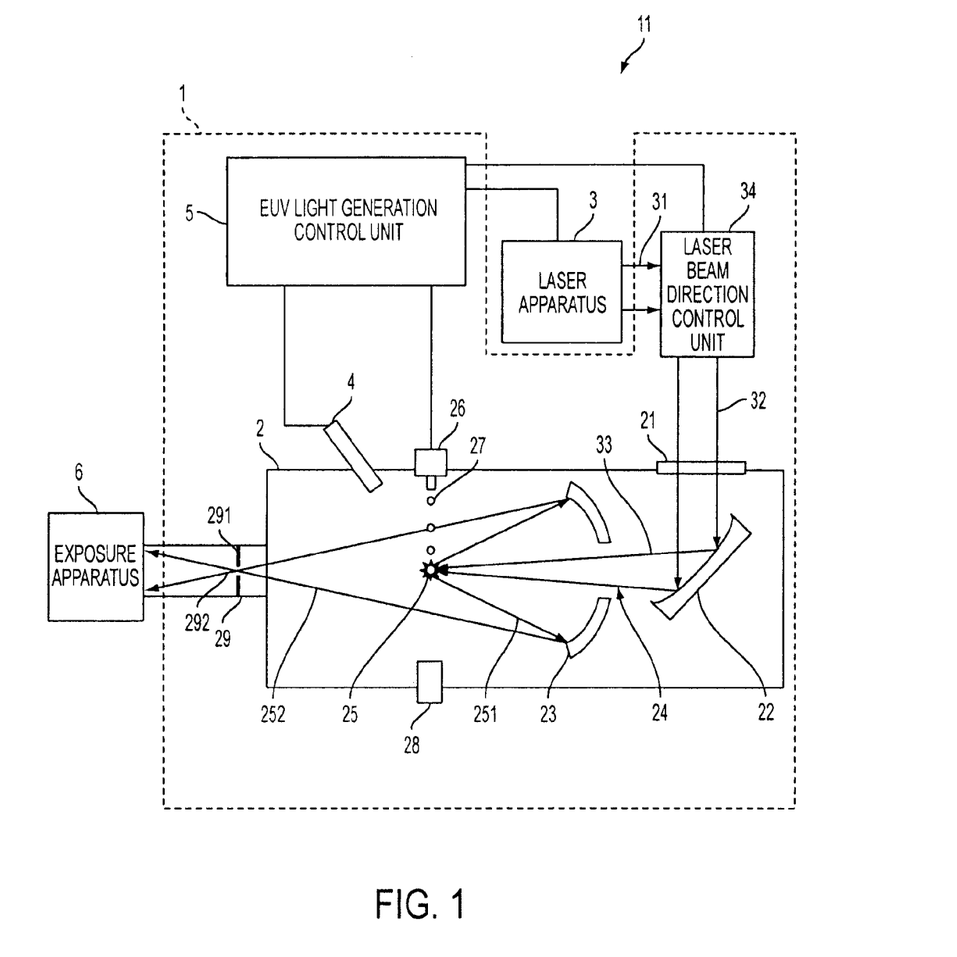
FIG. 1 schematically illustrates the configuration of an exemplary LPP type EUV light generation system.

FIG. 1 schematically illustrates the configuration of an exemplary LPP type EUV light generation apparatus 1. The EUV light generation apparatus 1 may be used with at least one laser apparatus 3. In this disclosure, a system including the EUV light generation apparatus 1 and the laser apparatus 3 may be referred to as an EUV light generation system 11. As illustrated in FIG. 1 and described in detail below, the EUV light generation apparatus 1 may include a chamber 2 and a target supply unit (droplet generator 26, for example). The chamber 2 may be airtightly sealed. The target supply unit may be mounted to the chamber 2 so as to penetrate a wall of the chamber 2, for example. A target material to be supplied by the target supply unit may include, but not limited to, tin, terbium, gadolinium, lithium, xenon, or any combination thereof.

The chamber 2 may have at least one through-hole formed in the wall thereof, and a pulsed laser beam 32 may travel through the through-hole. Alternatively, the chamber 2 may be provided with a window 21, through which the pulsed laser beam 32 may travel into the chamber 2. An EUV collector mirror 23 having a spheroidal reflective surface may be disposed inside the chamber 2, for example. The EUV collector mirror 23 may have a multi-layered reflective film formed on a surface thereof. The reflective film comprises a molybdenum layer and a silicon layer laminated alternately, for example. The EUV collector mirror 23 may have first and second foci, and may preferably be disposed such that the first focus lies in a plasma generation region 25 and the second focus lies in an intermediate focus (IF) 292 defined by the specification of an exposure apparatus. The EUV collector mirror 23 may have a through-hole 24 formed at the center thereof, and a pulsed laser beam 33 may travel through the through-hole 24.

Referring again to FIG. 1, the EUV light generation apparatus 1 may be connected to an EUV light generation control unit 5. Further, the EUV light generation apparatus 1 may include a target sensor 4. The target sensor 4 may have an imaging function and may detect at least one of the presence, trajectory, and position of a target.

Further, the EUV light generation apparatus 1 may include a connection 29 for allowing the interior of the chamber 2 and the interior of the exposure apparatus 6 to be in communication with each other. A partition 291 provided with an aperture may be disposed inside the connection 29. The partition 291 may be disposed such that the second focus of the EUV collector mirror 23 lies in the aperture formed in the partition 291.

The EUV light generation apparatus 1 may further include a laser beam direction control unit 34, a laser beam focusing mirror 22, and a target collection unit 28 for collecting targets 27. The laser beam direction control unit 34 may include an optical element for defining the direction into which the laser beam travels and an actuator for adjusting the position and the posture of the optical element.

2. 2 Operation

With reference to FIG. 1, a pulsed laser beam 31 outputted from the laser apparatus 3 may pass through the laser beam direction control unit 34, and as a pulsed laser beam 32, may travel through the window 21 and enter the chamber 2. The pulsed laser beam 32 may travel inside the chamber 2 along at least one beam path, be reflected by the laser beam focusing mirror 22, and strike at least one target 27, as a pulsed laser beam 33.

The droplet generator 26 may output the targets 27 toward the plasma generation region 25 inside the chamber 2. The target 27 may be irradiated with at least one pulse included in the pulsed laser beam 33. The target 27, which has been irradiated with the pulsed laser beam 33, may be turned into plasma, and rays of light including EUV light 252 may be emitted from the plasma. The EUV light 252 may be reflected selectively by the EUV collector mirror 23. The EUV light 252 reflected by the EUV collector mirror 23 may travel through the intermediate focus 292 and be outputted to the exposure apparatus 6. The target 27 may be irradiated with multiple pulses included in the pulsed laser beam 33.

The EUV light generation control unit 5 may control the EUV light generation system 11. The EUV light generation control unit 5 may process image data of the droplet 27 captured by the target sensor 4. Further, the EUV light generation control unit 5 may control at least one of the timing at which the target 27 is outputted and the direction into which the target 27 is outputted, for example. Furthermore, the EUV light generation control unit 5 may control at least one of the timing at which the laser apparatus 3 oscillates, the direction in which the pulsed laser beam 31 travels, and the position at which the pulsed laser beam 33 is focused, for example. The various controls mentioned above are merely examples, and other controls may be added as necessary.

3. Mirror Device Having Support Part and Clamp

3.1 Configuration

Figure 2:
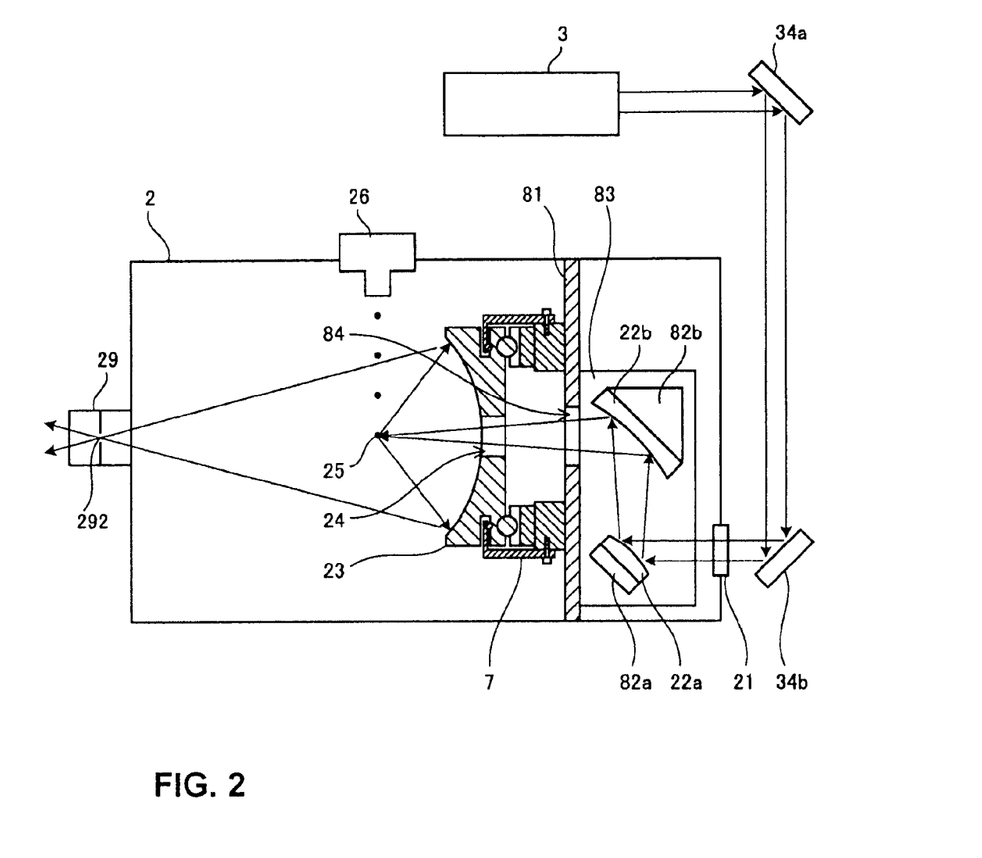
FIG. 2 schematically illustrates the configuration of an EUV light generation apparatus including mirror devices according to the embodiments of this disclosure.

FIG. 2 schematically illustrates the configuration of an EUV light generation apparatus to which mirror devices according to the embodiments of this disclosure are applied. In the EUV light generation apparatus, the EUV collector mirror 23 may be supported by a mirror support mechanism 7 inside the chamber 2. The mirror support mechanism 7 may be supported by a first support base plate 81 inside the chamber 2. The first support base plate 81 may have a through-hole 84 formed therein.

Inside the chamber 2, mirrors 22a and 22b, which collectively constitute the laser beam focusing optical system 22, may be supported by mirror holders 82a and 82b, respectively. The mirror holders 82a and 82b may both be attached to a second support base plate 83. The second support base plate 83 may be supported by the first support base plate 81 inside the chamber 2.

3.2 Operation

The pulsed laser beam outputted from the laser apparatus 3 may be reflected by high-reflection mirrors 34a and 34b, which constitute the laser beam direction control unit, and be directed so as to be incident on the window 21 of the chamber 2. The pulsed laser beam transmitted through the window 21 may enter the chamber 2, be reflected by the mirrors 22a and 22b, and be focused in the plasma generation region 25.

The EUV collector mirror 23 may be heated by radiation heat from the plasma, or by laser beams scattered as the pulsed laser beam is scattered by the target material, to thereby undergo thermal expansion. However, according to the mirror support mechanism of the embodiments of this disclosure, the EUV collector mirror 23 may be positioned with high reproducibility, and thermal deformation in the EUV collector mirror 23 may be suppressed.

4. Embodiments of Mirror Support Mechanism

4.1 First Embodiment

Figure 3A:
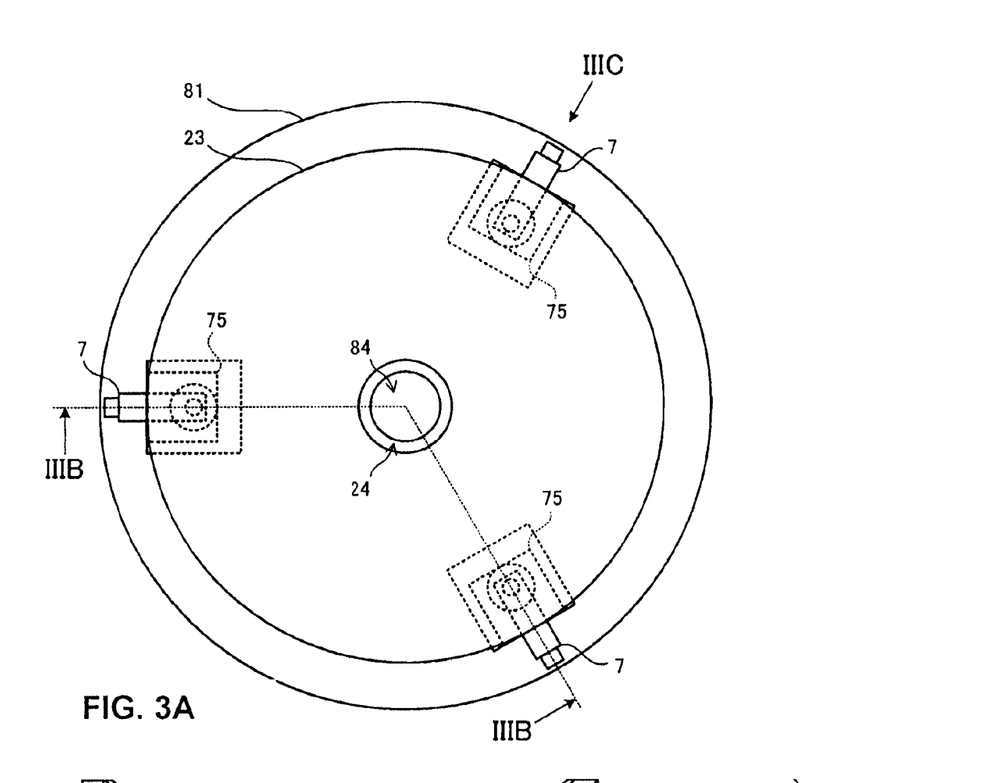
FIG. 3A is a plan view illustrating an EUV collector mirror supported by mirror support mechanisms attached to a first support base plate according to a first embodiment.
Figure 3B:
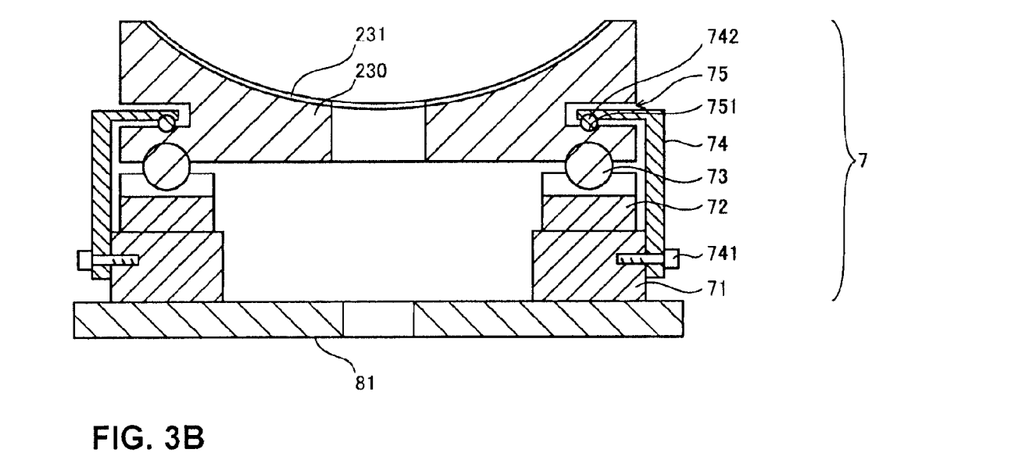
FIG. 3B is a sectional view, taken along IIIB-IIIB plane, of the mirror support mechanisms shown in FIG. 3A.
Figure 3C:
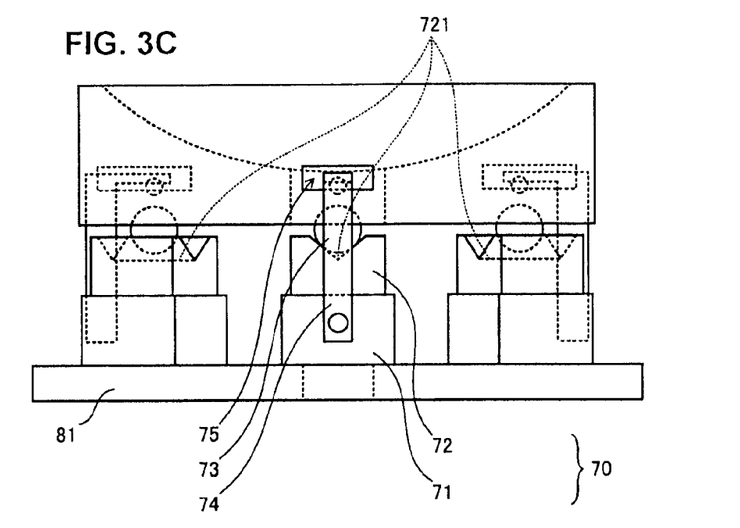
FIG. 3C is a side view of the mirror support mechanisms shown in FIG. 3A, viewed in the direction indicated with an arrow IIIC.

FIG. 3A is a plan view illustrating an EUV collector mirror supported by mirror support mechanisms attached to a first support base plate according to a first embodiment. FIG. 3B is a sectional view, taken along IIIB-IIIB plane, of the mirror support mechanisms shown in FIG. 3A. FIG. 3C is a side view of the mirror support mechanisms shown in FIG. 3A, viewed in the direction indicated with an arrow IIIC. As illustrated in FIGS. 3A through 3C, three mirror support mechanisms 7, for example, attached to the first support base plate 81 may support the EUV collector mirror 23. The three mirror support mechanisms 7 may, for example, be disposed along the periphery of the EUV collector mirror 23 so as to be substantially equally spaced from one another in the circumferential direction. Each mirror support mechanism 7 may include a support part 70 and a clamp 74.

The support part 70 may comprises a support member 71 and a base member 72 in which a groove is formed. The support member 71 may be positioned at a predetermined position in the first support base plate 81 and be attached therein. The base member 72 may be positioned at a predetermined position in the support member 71 and be attached therein. As illustrated in FIG. 3C, a V-shaped groove 721 may be formed, for example in the base member 72 in a surface facing the EUV collector mirror 23. The three base members 72 may be arranged such that the three grooves 721 formed in the three base members 72 extend radially based on the rotational axis of the EUV collector mirror 23.

The EUV collector mirror 23 may include a mirror base 230 serving as a base member. A multi-layered film (multi-layered reflective film) 231 may be formed on a surface of the mirror base 230. A plurality of protrusions 73 may be formed on the rear surface of the EUV collector mirror 23, that is, the side opposite to the surface where the multi-layered film 231 is formed. The number of the protrusions 73 may correspond to the number of the aforementioned grooves 721, and in this embodiment, three protrusions 73 may be formed. As illustrated in FIG. 3B, each protrusion 73 may be configured of a spherical body, part of which is fitted into the mirror base 230, for example.

The clamp 74 may comprise an L-shaped member, for example. A first end of the clamp 74 may be attached to the support member 71 by a bolt 741.

A second end of the clamp 74 may be positioned so as to press the protrusion 73 toward the groove 721 through a part of the mirror base 230. With this, the mirror base 230 may be supported by the support part 70. To be more specific, three holes 75 may be formed in the side surface of the mirror base 230, and the second ends of the three clamps 74 may be inserted in the holes 75, respectively. A spherical recess 751 may be formed in each hole 75 in a side surface toward the protrusion 73. A ball 742, of which the diameter is smaller than the diameter of the recess 751, may be attached to the second end of the clamp 74. The ball 742 may be, when inserted in the recess 751, in point-contact with an inner surface of the recess 751 because the diameter of the ball 742 is smaller than that of the recess 751.

With this, two points at which the protrusion 73 makes contact with the inner surface of the groove 721, the center of the spherical body of the protrusion 73, and a point at which the ball 742 makes contact with the inner surface of the recess 751 are arranged on one hypothetical plane. The hypothetical plane perpendicularly extends from the first support base plate 81 toward the surface of the mirror base 230 through the two points at which the protrusion 73 makes contact with the inner surface of the groove 721, the center of the spherical body of the protrusion 73, and the point at which the ball 742 makes contact with the inner surface of the recess 751 (see FIGS. 3B and 3C). Because of such arrangement of the groove 721, the protrusion 73, and the ball 742, when the protrusion 73 having the spherical body slides along the groove 721, the clamp 74 bends. Even so, the ball 742 may hardly move within the recess 751, i.e., the point at which the ball 742 makes contact with the recess 751 may not move largely. As a result, the direction of the force with which the clamp 74 holds the mirror base 230 may be retained substantially constant.

In the above configuration, the mirror base 230 is disposed so that the three protrusions 73 engages respectively with the three grooves 721 formed radially from the rotational axis (the center axis) of the EUV collector mirror. Accordingly, the mirror base 230 can uniquely be positioned. In general, when a disc-shaped body undergoes thermal expansion, the deformation amount is larger in the radial direction. When the mirror base 230 is heated and undergoes thermal expansion, the protrusions 73 may slide along the grooves 721 toward the periphery of the EUV collector mirror 23. In this way, the stress associated with the thermal expansion may be released in the direction toward the periphery. When the mirror base 230 is cooled and shrinks, the protrusions 73 may slide along the grooves 721 toward the rotational axis of the EUV collector mirror 23. As a result, even when the mirror base 230 expands or shrinks, the spatial position of the rotational axis of the mirror base 230 may be prevented from being displaced.

As discussed above, even when the mirror base 230 expands or shrinks, the direction of the force with which the clamp 74 holds the mirror base 230 may be retained substantially constant. Further, even when the mirror base 230 expands or shrinks, the ball 742 may move along with the recess 751. Accordingly, even when the mirror base 230 expands or shrinks, the force added to the mirror base 230 may not fluctuate largely, whereby the deformation in the mirror base 230 may be suppressed. The mirror base 230 may be easily removed by untightening the bolt 741 to remove the clamp 74.

4. 2 Second Embodiment

Figure 4A:
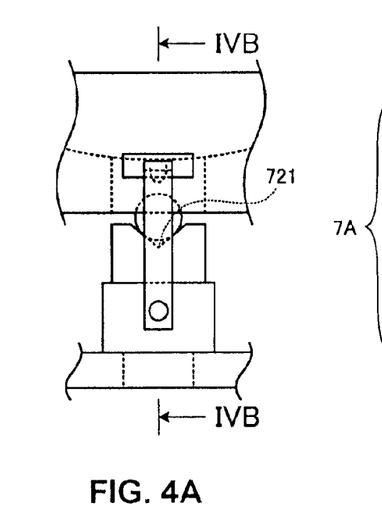
FIG. 4A is a side view illustrating a mirror support mechanism according to a second embodiment.
Figure 4B:
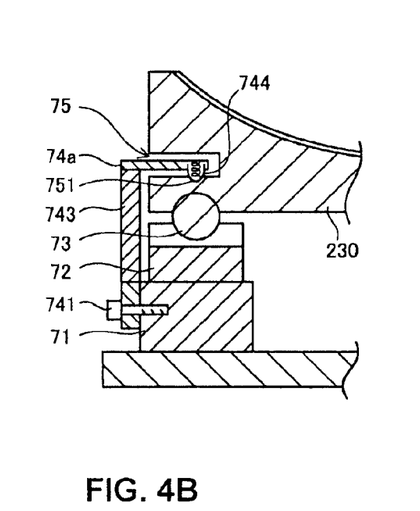
FIG. 4B is a sectional view, taken along IVB-IVB plane, of the mirror support mechanism shown in FIG. 4A.

FIG. 4A is a side view illustrating a mirror support mechanism according to a second embodiment. FIG. 4B is a sectional view, taken along IVB-IVB plane, of the mirror support mechanism shown in FIG. 4A. FIGS. 4A and 4B illustrate only one mirror support mechanism 7A and only a part of the mirror base 230. The general configuration of the mirror support mechanism 7A and the mirror base 230 may be similar to that of the mirror support mechanism 7 and the mirror base 230 according to the first embodiment.

The mirror support mechanism 7A according to the second embodiment may differ from the mirror support mechanism 7 in that a plunger 744, in place of the ball 742, is formed at a mirror-side end of a clamp 74a. The plunger 744 is a protrusion embedded with a spring. The plunger 744 makes point-contact with the inner surface of the recess 751 to position the mirror-side end of the clamp 74a with respect to the mirror base 2301.

Further, the mirror support mechanism 7A may differ from the mirror support mechanism 7 in that part of the clamp 74a is configured of a leaf spring 743. At least part of the clamp 74a extending in the direction perpendicular to the first support base plate may be formed of the leaf spring 743. According to this configuration, the plunger 744 may move easily in the direction toward the periphery of the mirror base 230 as the leaf spring 743 bends. Accordingly, the plunger 744 may easily follow the expansion or shrinkage of the mirror base 230 caused by a change in temperature.

4. 3 Third Embodiment

Figure 5A:
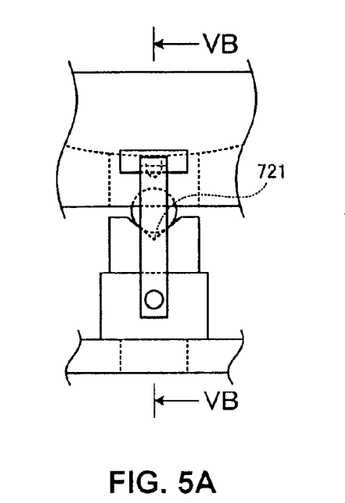
FIG. 5A is a side view illustrating a mirror support mechanism according to a third embodiment.
Figure 5B:
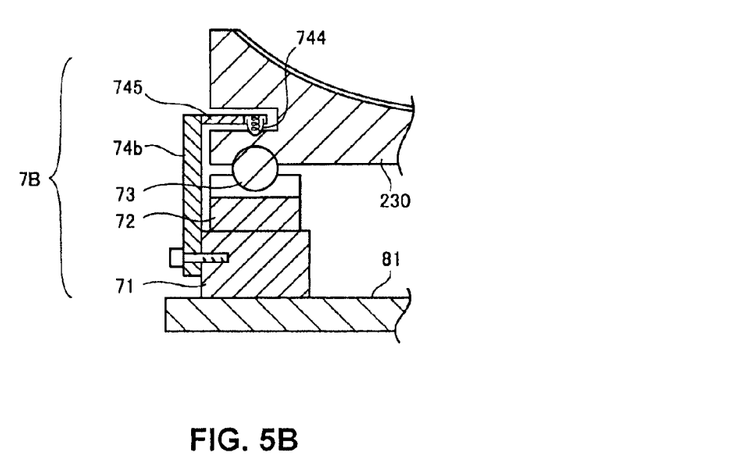
FIG. 5B is a sectional view, taken along VB-VB plane, of the mirror support mechanism shown in FIG. 5A.

FIG. 5A is a side view illustrating a mirror support mechanism according to a third embodiment. FIG. 5B is a sectional view, taken along VB-VB plane, of the mirror support mechanism shown in FIG. 5A. FIGS. 5A and 5B illustrate only one mirror support mechanism 7B and only a part of the mirror base 230. The general configuration of the mirror support mechanism 7B and the mirror base 230 may be similar to that of the mirror support mechanism 7 and the mirror base 230 according to the first embodiment.

The mirror support mechanism 7B according to the third embodiment may differ from the mirror support mechanism 7A in the location of a leaf spring 745 in a clamp 74b. In the third embodiment, at least part of the clamp 74b parallel to the first support base plate 81 may be formed of the leaf spring 745. According to this configuration, the plunger 744 may move in the direction perpendicular to the first support base plate 81 as the leaf spring 745 bends. Accordingly, the stress associated with the expansion or shrinkage in the thickness direction of the mirror base 230 may be released.

4. 4 Fourth Embodiment

Figure 6A:
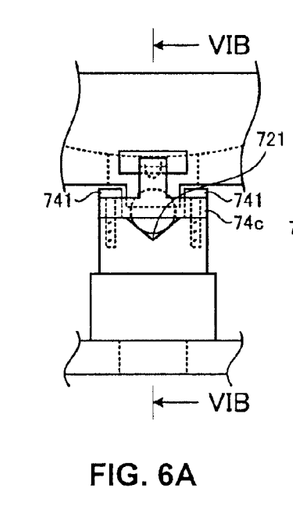
FIG. 6A is a side view illustrating a mirror support mechanism according to a fourth embodiment.
Figure 6B:
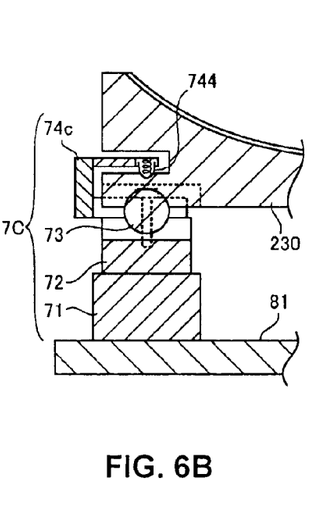
FIG. 6B is a sectional view, taken along VIB-VIB plane, of the mirror support mechanism shown in FIG. 6A.
Figure 6C:
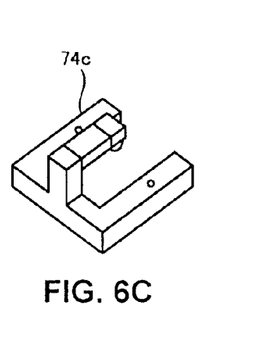
FIG. 6C is a perspective view of a clamp of the mirror support mechanism.

FIG. 6A is a side view illustrating a mirror support mechanism according to a fourth embodiment. FIG. 6B is a sectional view, taken along VIB-VIB plane, of the mirror support mechanism shown in FIG. 6A. FIG. 6C is a perspective view of a clamp according to the fourth embodiment. FIGS. 6A and 6B illustrate only one mirror support mechanism 7C and only a part of the mirror base 230. The general configuration of the mirror support mechanism 7C and the mirror base 230 may be similar to that of the mirror support mechanism 7 and the mirror base 230 according to the first embodiment.

The mirror support mechanism 7C according to the fourth embodiment may differ from the mirror support mechanisms of the above embodiments in the shape of a clamp 74c. The end of the clamp 74c, which is attached to the base member 72, may bifurcate into two as shown in FIG. 6C. The end of the clamp 74c may be attached to an upper surface of the base member 72 with bolts 741. In the above configuration, the center of the spherical body of the protrusion 73, the respective centers of the two bolts 741 attaching the clamp 74c to the base member 72, and a point at which the plunger 744 makes contact with the mirror base 230 can be arranged in one hypothetical plane. The one hypothetical plane perpendicularly extends from the first support base plate 81 through the center of the protrusion 73, the respective centers of the two bolts 741, and the point at which the plunger 744 makes contact with the mirror base 230 (see FIGS. 6A and 6B). With this, the direction of the force with which the clamp 74c holds the mirror base 230 may be retained substantially constant.

4. 5 Fifth Embodiment

Figure 7A:
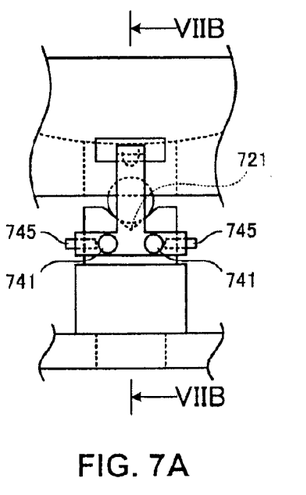
FIG. 7A is a side view illustrating a mirror support mechanism according to a fifth embodiment.
Figure 7B:
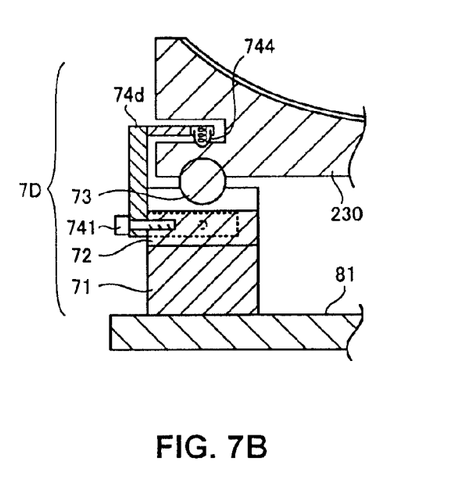
FIG. 7B is a sectional view, taken along VIIB-VIIB plane, of the mirror support mechanism shown in FIG. 7A.

FIG. 7A is a side view illustrating a mirror support mechanism according to a fifth embodiment. FIG. 7B is a sectional view, taken along VIIB-VIIB plane, of the mirror support mechanism shown in FIG. 7A. FIGS. 7A and 7B illustrate only one mirror support mechanism 7C and only a part of the mirror base 230. The general configuration of the mirror base 230 may be similar to that of the mirror base 230 according to the first embodiment.

The mirror support mechanism 7D according to the fifth embodiment may differ from the mirror support mechanisms of the above embodiments in the shape of a clamp 74d. The end of the clamp 74d, which is attached to the base member 72, may bifurcate into two. The end of the clamp 74d may be positioned to a side surface of the base member 72 by pins 745. The clamp 74d may be attached to another side surface of the base member 72 by bolts 741. In the above configuration, the center of the spherical body of the protrusion 73, two points at which the clamp 74d is positioned by the pins 745, and a point at which the plunger 744 makes contact with the mirror base 230 can be arranged on one hypothetical plane. The one hypothetical plane perpendicularly extends from the first support base plate 81 through the center of the spherical body of the protrusion 73, the two points at which the clamp 74d is positioned by the pins 745, and a point at which the plunger 744 makes contact with the mirror base 230. With this, the direction of the force with which the clamp 74d holds the mirror base 230 may be retained substantially constant.

4. 6 Sixth Embodiment

Figures 8A, 8B:
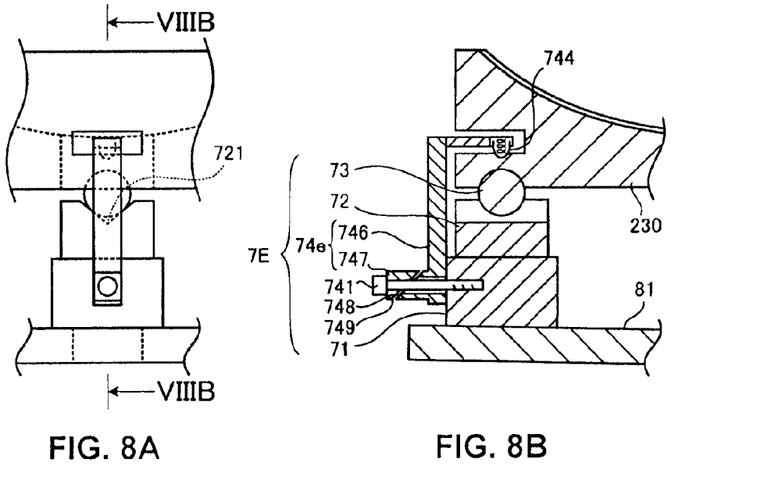
FIG. 8A is a side view illustrating a mirror support mechanism according to a sixth embodiment.
FIG. 8B is a sectional view, taken along VIIIB-VIIIB plane, of the mirror support mechanism shown in FIG. 8A.

FIG. 8A is a side view illustrating a mirror support mechanism according to a sixth embodiment. FIG. 8B is a sectional view, taken along VIIIB-VIIIB plane, of the mirror support mechanism shown in FIG. 8A. FIGS. 8A and 8B illustrate only one mirror support mechanism 7E and only a part of the mirror base 230. The general configuration of the mirror base 230 may be similar to that of the mirror base 230 according to the first embodiment.

The mirror support mechanism 7E according to the sixth embodiment may differ from the mirror support mechanisms of the above embodiments in the structure and the function of a clamp 74e. The clamp 74e according to the sixth embodiment may include a clamp body 746 having a inclined surface 748 formed at an end to be attached to the support part and a push-in part 747 (See FIG. 8B) having a inclined surface 749. The bolt 741 may pass through a through-hole formed in the push-in part 747 and a through-hole formed in the clamp body 746 and be screwed into the support member 71 so that the clamp body 746 and the push-in part 747 are attached to the support part such that the inclined surfaces 748 and 749 face each other. The through-hole in the clamp body 746 may be elongated in a direction perpendicular to the surface of the first support base plate 81 as shown in FIG. 8B. Accordingly, the clamp body 746 may be allowed to move in the direction perpendicular to the surface of the first support base plate 81.

In the above configuration, when the bolt 741 is screwed into the support member 71, the clamp body 746 is pushed toward the first support base plate 81 as the inclined surfaces 748 and 749 abut against each other. With this, the direction of the force with which the plunger 744 holds the mirror base 230 may be retained substantially constant while the retaining force is increased as well.

4. 7 Seventh Embodiment

Figure 9A:
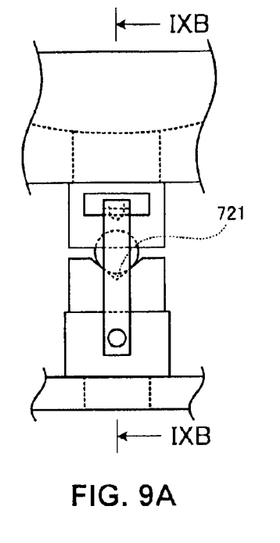
FIG. 9A is a side view illustrating a mirror support mechanism according to a seventh embodiment.
Figure 9B:
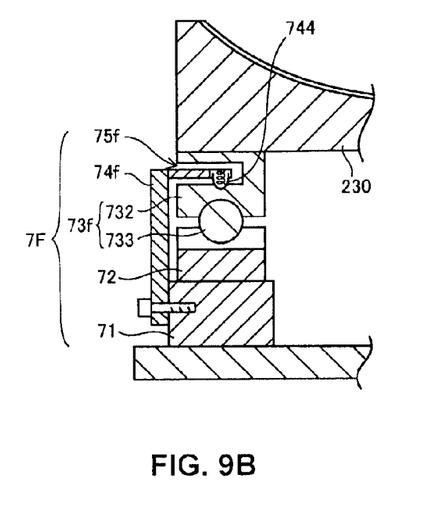
FIG. 9B is a sectional view, taken along IXB-IXB plane, of the mirror support mechanism shown in FIG. 9A.

FIG. 9A is a side view illustrating a mirror support mechanism according to a seventh embodiment. FIG. 9B is a sectional view, taken along IXB-IXB plane, of the mirror support mechanism shown in FIG. 9A. FIGS. 9A and 9B illustrate only one mirror support mechanism 7F and only a part of the mirror base 230.

The mirror support mechanism 7F according to the seventh embodiment may differ from the mirror support mechanisms of the above embodiments in that the configuration of a protrusion 73f differs from that of the protrusion 73. The protrusion 73f according to the seventh embodiment may include seat 732 and a spherical body 733. The seat 732 may be attached to the rear surface of the mirror base 230. Part of the spherical body 733 may be fitted into the seat 732, and a hole 75f may be formed in the seat 732. In the seventh embodiment, the hole 75f may not need to be formed in the mirror base 230. One end of a clamp 74f including the plunger 744 may be inserted into the hole 75f, and the spherical body 733 may be pushed into the groove 721 by the plunger 744. The clamp 74f may be configured similarly to the clamp 74b shown in FIG. 5B. Since the spherical body 733 is configured separately from the seat 732, the spherical body 733 may be allowed to roll within the groove 721. As a result, the friction force that the spherical body 733 experiences with the groove 721 when the mirror base 230 expands or shrinks may be reduced.

4. 8 Eighth Embodiment

Figure 10A:
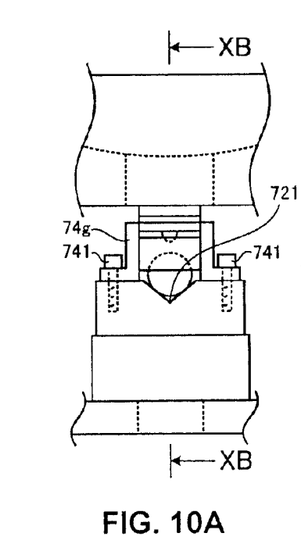
FIG. 10A is a side view illustrating a mirror support mechanism according to an eighth embodiment.
Figure 10B:
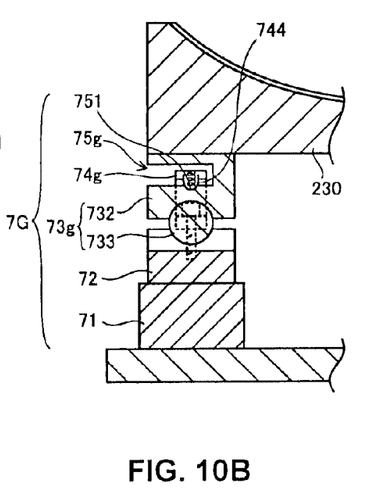
FIG. 10B is a sectional view, taken along XB-XB plane, of the mirror support mechanism shown in FIG. 10A.
Figure 10C:
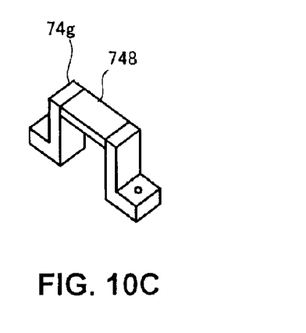
FIG. 10C is a perspective view of a clamp according to the eighth embodiment.

FIG. 10A is a side view illustrating a mirror support mechanism according to an eighth embodiment. FIG. 10B is a sectional view, taken along XB-XB plane, of the mirror support mechanism shown in FIG. 10A. FIG. 10C is a perspective view of a clamp according to the eighth embodiment.

FIGS. 10A and 10B illustrate only one mirror support mechanism 7G and only a part of the mirror base 230. The general configuration of the mirror base 230 may be similar to that of the mirror base 230 according to the seventh embodiment.

The mirror support mechanism 7G according to the eighth embodiment may differ from the mirror support mechanisms of the above embodiments in the shape of a clamp 74g. In the eighth embodiment, both ends of the clamp 74g may be attached to the upper surface of the base member 72 by bolts 741. Further, the middle portion of the clamp 74g may be formed of a leaf spring 748. The middle portion of the clamp 74g may be inserted into a slit 75g of the seat 732, and the plunger 744 formed at the middle portion of the clamp 74g may be fitted into the recess 751 formed in the slit 75g. In the above configuration, the center of the spherical body 733 constituting the protrusion 73g, the respective centers of points at which the clamp 74g is attached to the base member 72 with the two bolts 741, and a point at which the plunger 744 makes contact with the mirror base 230 can be arranged in one hypothetical plane. The one hypothetical plane perpendicularly extends from the first support base plate 81 through the center of the spherical body 733 constituting the protrusion 73g, the respective centers of points at which the clamp 74g is attached to the base member 72 with the two bolts 741, and a point at which the plunger 744 makes contact with the mirror base 230 (see FIGS. 10A and 10B). With this, the direction of the force with which the clamp 74g holds the mirror base 230 may be retained substantially constant.

4. 9 Ninth Embodiment

Figure 11A:
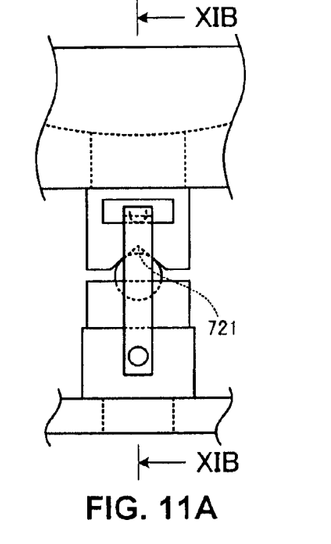
FIG. 11A is a side view illustrating a mirror support mechanism according to a ninth embodiment.
Figure 11B:
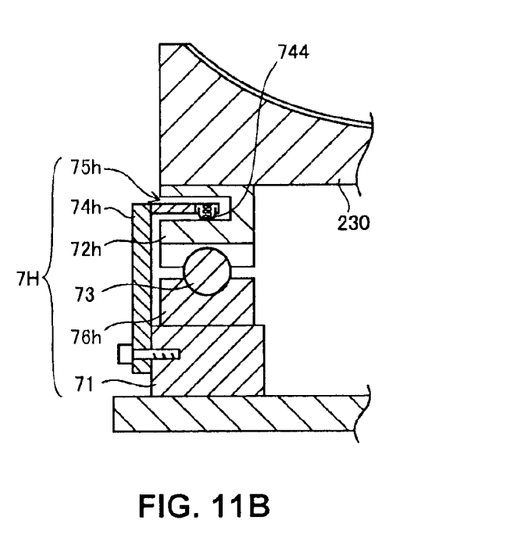
FIG. 11B is a sectional view, taken along XIB-XIB plane, of the mirror support mechanism shown in FIG. 11A.

FIG. 11A is a side view illustrating a mirror support mechanism according to a ninth embodiment. FIG. 11B is a sectional view, taken along XIB-XIB plane, of the mirror support mechanism shown in FIG. 11A. FIGS. 11A and 11B illustrate only one mirror support mechanism 7H and only a part of the mirror base 230. The general configuration of the mirror base 230 may be similar to that of the mirror base 230 according to the seventh embodiment.

The mirror support mechanism 7H according to the ninth embodiment may differ from the mirror support mechanisms of the above embodiments in that a base member 72h in which the groove 721 is formed is attached to the rear surface of the mirror base 230 and a base member 76h on which the protrusion 73 is formed is attached to the support member 71. The groove 721 may be formed in a surface of the base member 72h to face the support member 71. The protrusion 73 may be formed on a surface of the base member 76h to face the mirror base 230.

The plunger 744 inside a hole 75h formed in the base member 72h may bias the base member 72h such that the inner surface of the groove 721 is pushed toward the center of the protrusion 73. A recess for the plunger 744 is not formed in the hole 75h; thus, the plunger 744 may slide against the inner surface of the hole 75h.

In the above configuration, even when the mirror base 230 expands or shrinks due to a change in temperature, the base member 72h may move along the inner surface of the groove 721 with respect to the protrusion 73. Further, even when the base member 72h in which the hole 75h is formed moves in accordance with the expansion or shrinkage of the mirror base 230, the plunger 744 may slide against the inner surface of the hole 75h. Accordingly, even when the mirror base 230 expands or shrinks, the direction of the force with which the clamp 74h holds the mirror base 230 may be retained substantially constant. With this, unbalanced deformation in the mirror base 230 may be suppressed.

4. 10 Tenth Embodiment

Figure 12A:
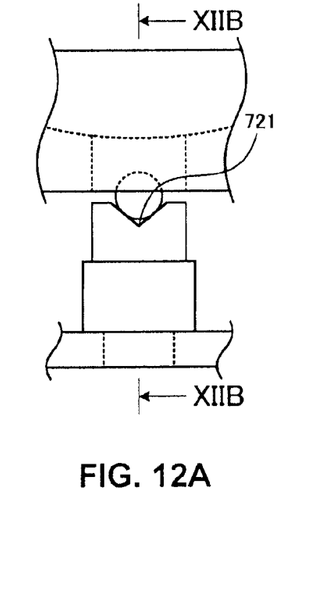
FIG. 12A is a side view illustrating a mirror support mechanism according to a tenth embodiment.
Figure 12B:
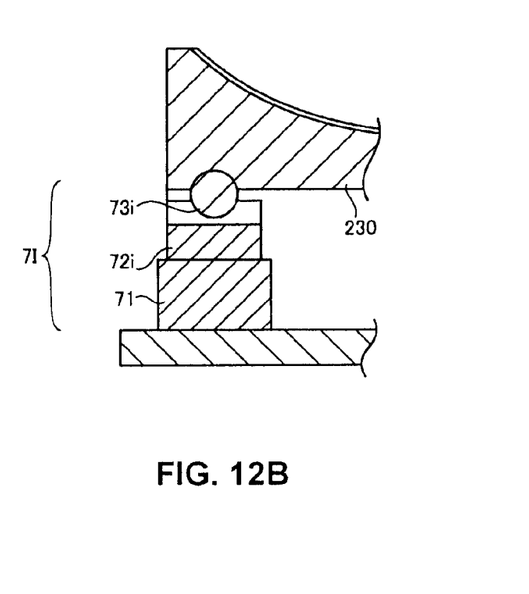
FIG. 12B is a sectional view, taken along XIIB-XIIB plane, of the mirror support mechanism shown in FIG. 12A.

FIG. 12A is a side view illustrating a mirror support mechanism according to a tenth embodiment. FIG. 12B is a sectional view, taken along XIIB-XIIB plane, of the mirror support mechanism shown in FIG. 12A. FIGS. 12A and 12B illustrate only one mirror support mechanism 7I and only a part of the mirror base 230.

The mirror support mechanism 7I according to the tenth embodiment may differ from the mirror support mechanisms of the above embodiments in that the mirror support mechanism 7I does not include a clamp but includes a magnetic body, by which a protrusion 73i and a base member 72i in which a groove is formed are attracted to each other. For example, the protrusion 73i may be made of a ferromagnetic metal material, such as iron, and the base member 72i may be made of a permanent magnet such as a ferrite magnet or a neodymium magnet. With this, the ferromagnetic material and the magnet are attracted to each other due to the magnetic force; thus, the protrusion 73i may be pushed against the base member 72i.

In the above configuration, even when the mirror base 230 expands or shrinks due to a change in temperature, the protrusion 73i may slide along the groove 721 while being pushed against the groove 721. With this, unbalanced deformation in the mirror base 230 may be suppressed.

4. 11 Eleventh Embodiment

Figure 13A:
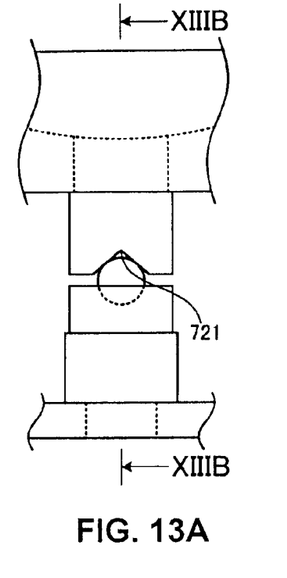
FIG. 13A is a side view illustrating a mirror support mechanism according to an eleventh embodiment.
Figure 13B:
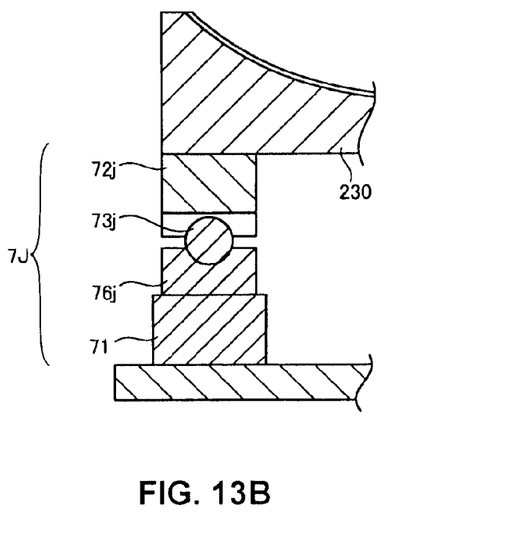
FIG. 13B is a sectional view, taken along XIIIB-XIIIB plane, of the mirror support mechanism shown in FIG. 13A.

FIG. 13A is a side view illustrating a mirror support mechanism according to an eleventh embodiment. FIG. 13B is a sectional view, taken along XIIIB-XIIIB plane, of the mirror support mechanism shown in FIG. 13A. FIGS. 13A and 13B illustrate only one mirror support mechanism 7J and only a part of the mirror base 230. The general configuration of the mirror support mechanism 7J and the mirror base 230 may be similar to that of the mirror support mechanism 7I and the mirror base 230 according to the tenth embodiment.

The mirror support mechanism 7J according to the eleventh embodiment may differ from the mirror support mechanisms of the first through ninth embodiments in that the mirror support mechanism 7J does not include a clamp but includes a magnetic body, by which a protrusion 73j and a base member 72j in which a groove is formed are attracted to each other. For example, the base member 72j may be made of a permanent magnet such as a ferrite magnet or neodymium magnet and the protrusion 73j may be made of a ferromagnetic metal material, such as iron. With this, the ferromagnetic material and the magnet are attracted to each other due to the magnetic force; thus, the base member 72j may be pushed against the protrusion 73j.

In the above configuration, even when the mirror base 230 expands or shrinks due to a change in temperature, the groove 721 may slide and move with respect to the protrusion 73j. With this, unbalanced deformation in the mirror base 230 may be suppressed.

4. 12 Twelfth Embodiment

Figure 14:
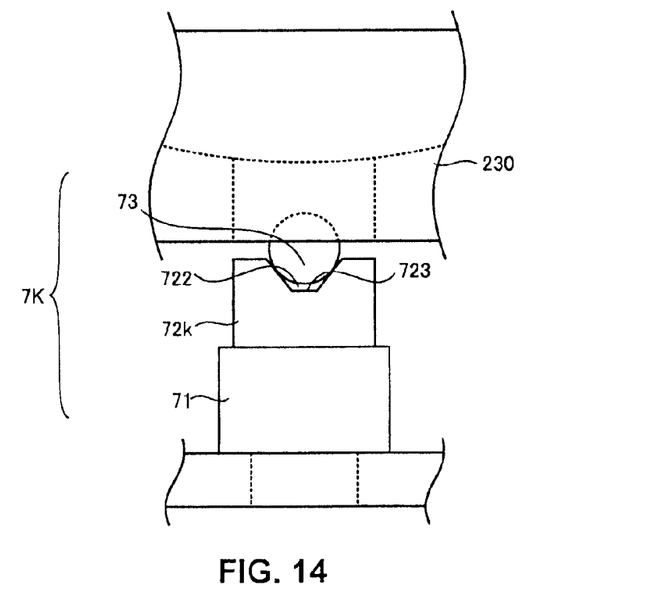
FIG. 14 is a side view illustrating a mirror support mechanism according to a twelfth embodiment.

FIG. 14 is a side view illustrating a mirror support mechanism according to a twelfth embodiment. FIG. 14 illustrates only one mirror support mechanism 7K and only a part of the mirror base 230. Further, FIG. 14 illustrates only the support member 71, a base member 72k, and the protrusion 73 inside the mirror support mechanism 7K.

The mirror support mechanism 7K according to the twelfth embodiment may differ from the mirror support mechanisms of the above embodiments in that the sectional shape of a groove 722 formed in the base member 72k does not takes on a V-shape but the groove 722 has a flat bottom 723. In this way, the groove 722 may not need to be V-shaped as long as a groove has a pair of inclined surfaces which converges toward the direction into which the groove are pressurized by the protrusion 73.

4. 13 Thirteenth Embodiment

Figure 15:
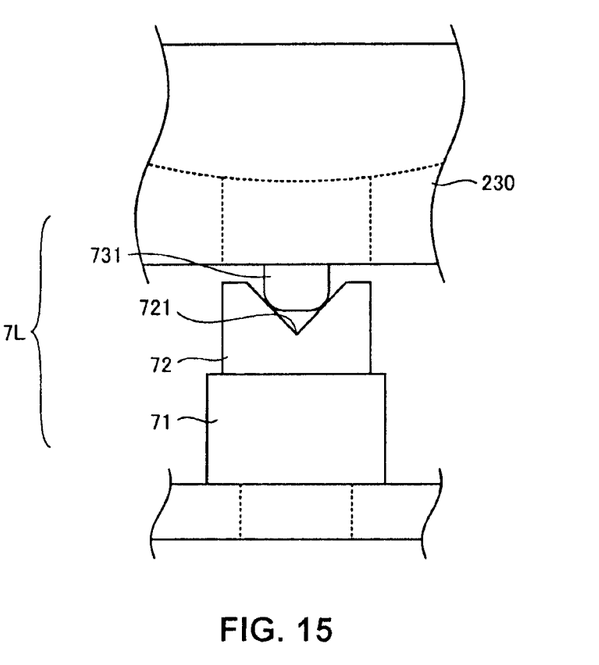
FIG. 15 is a side view illustrating a mirror support mechanism according to a thirteenth embodiment.

FIG. 15 is a side view illustrating a mirror support mechanism according to a thirteenth embodiment. FIG. 15 illustrates only one mirror support mechanism 7L and only a part of the mirror base 230. Further, FIG. 15 illustrates only the support member 71, the base member 72, and a protrusion 731 inside the mirror support mechanism 7L.

The mirror support mechanism 7L according to the thirteenth embodiment may differ from the mirror support mechanisms of the above embodiments in that the protrusion 731 does not have a spherical body but takes on a rod shape having a spherical portion at the tip thereof. Here, the protrusion 731 does not need to be spherical in shape as long as the protrusion 731 makes point-contact with the pair of inclined surfaces of the groove 721.

The above-described embodiments and the modifications thereof are merely examples for implementing this disclosure, and this disclosure is not limited thereto. Making various modifications according to the specifications or the like is within the scope of this disclosure, and it is apparent from the above description that other various embodiments are possible within the scope of this disclosure. For example, the modifications illustrated for particular ones of the embodiments can be applied to other embodiments as well (including the other embodiments described herein).

The terms used in this specification and the appended claims should be interpreted as "non-limiting." For example, the terms "include" and "be included" should be interpreted as "including the stated elements but not being limited to the stated elements." The term "have" should be interpreted as "including the stated elements but not being limited to the stated elements." Further, the modifier "one (a/an)" should be interpreted as "at least one" or "one or more."

What is claimed is:
1. A mirror device, comprising:
   a mirror including
      a base plate having a surface a second surface opposite to the first surface, and a side surface different from the first and second surfaces, the side surface having a plurality of holes,
      a reflective film on the first surface of the base plate, and
      a plurality of first protrusions on the second surface of the base plate;
   a plurality of support parts for respectively supporting the plurality of the first protrusions, each support part having a groove for guiding the first protrusion; and
   a plurality of clamps each having a first portion secured on corresponding one of the plurality of support parts and a second portion positioned in corresponding one of the plurality of holes, the plurality of clamps being configured to press respectively the plurality of the first protrusions against grooves in the plurality of the support parts.

2. The mirror device according to claim 1, wherein
each groove has a pair of tapered surfaces,
each first protrusion comprises a spherical body, part of which is fitted in the second surface of the mirror,
each of the plurality of the clamps has a second protrusion for pushing a corresponding first protrusion against a corresponding groove, and
a point at which force is applied to push the corresponding first protrusion by the second protrusion, two points at which the spherical body makes contact with the pair of tapered surfaces, and the center of the spherical body are arranged in one hypothetical plane.

3. The mirror device according to claim 2, wherein
a plurality of recesses is formed in respective inner surfaces of the plurality of holes for positioning second protrusions of the plurality of clamps, respectively, and
a point at which each second protrusion makes contact with an inner surface of corresponding one of the recesses is the point at which force is applied to push the corresponding first protrusion by the second protrusion, and arranged in the one hypothetical plane.

4. The mirror device according to claim 2, wherein the second protrusion comprises a plunger.

5. The mirror device according to claim 2, wherein the second protrusion comprises a ball.

6. The mirror device according to claim 1, wherein first portions of the plurality of cramps are secured to surfaces of the plurality of support parts, respectively, the surfaces facing the second surface.

7. The mirror device according to claim 6, wherein second portions of the plurality of cramps have end portions, respectively, the end portions being positioned in the plurality of holes, respectively, the plurality of holes extending inwardly from an outer edge of the reflective film.

8. The mirror device according to claim 7, wherein
the plurality of first protrusions comprises three first protrusions, and
the plurality of support parts comprises three support parts to support the three first protrusions, respectively.

9. The mirror device according to claim 7, wherein
the mirror is substantially circular in shape, and
the plurality of the grooves are formed radially with respect to the rotational axis of the mirror.

10. The mirror device according to claim 7, wherein each of the plurality of the first protrusions comprises a spherical body, part of which is fitted in the second surface of the mirror.

11. A mirror device, comprising:
a mirror including
a base plate having a first surface and a second surface opposite to the first surface,
a reflective film on the first surface of the base plate, and
a plurality of base members on the second surface of the base plate, each of the base members having a groove and a side surface with a hole:
a plurality of support parts for supporting the plurality of the base members respectively, each of the plurality of support parts including a first protrusion to be guided along the groove in corresponding one of the base members; and
a plurality of clamps each having a first portion secured on corresponding one of the plurality of support parts and a second portion positioned in the hole of one of the plurality of base members supported by the corresponding one of the plurality of support parts, the plurality of clamps pushing the plurality of the base members respectively against the first protrusions of the support parts.

12. The mirror device according to claim 11, wherein second portions of the plurality of cramps have end portions, respectively, the end portions being positioned in the plurality of holes, respectively, the plurality of holes extending inwardly from an outer edge of the reflective film.

13. The mirror device according to claim 12, wherein
the plurality of base members comprises three base members, and
the plurality of support parts comprises three support parts to support the three base members, respectively.

14. The mirror device according to claim 12, wherein
the mirror is substantially circular in shape, and
grooves of the plurality of base members are arranged radially with respect to a rotational axis of the mirror.

15. The mirror device according to claim 12, wherein each first protrusion has a spherical body, a part of which is fitted into the support part.

16. The mirror device according to claim 12, wherein
each groove has a pair of tapered surfaces,
each first protrusion comprises a spherical body, part of which is fitted into the support part,
each of the plurality of the clamps has a second protrusion for pushing a corresponding groove against a corresponding first protrusion, and
a point at which force is applied to push the corresponding groove by the second protrusion, two points at which the spherical body makes contact with the pair of tapered surfaces, and the center of the spherical body are arranged in one hypothetical plane.

17. The mirror device according to claim 16, wherein the second protrusion comprises a plunger.

* * * * *